United States Patent
Shapira et al.

(10) Patent No.: US 10,691,576 B1
(45) Date of Patent: Jun. 23, 2020

(54) MULTIPLE RESET TYPES IN A SYSTEM

(71) Applicant: Amazon Technologies, Inc., Seattle, WA (US)

(72) Inventors: Yaniv Shapira, Bet Itzhak (IL); Gil Stoler, Nofit (IL); Adi Habusha, Moshav Alonei Abba (IL)

(73) Assignee: Amazon Technologies, Inc., Seattle, WA (US)

( * ) Notice: Subject to any disclaimer, the term of this patent is extended or adjusted under 35 U.S.C. 154(b) by 186 days.

(21) Appl. No.: 15/716,319

(22) Filed: Sep. 26, 2017

(51) Int. Cl.
*G06F 11/36* (2006.01)
*G01R 31/317* (2006.01)
*G06F 11/263* (2006.01)
*G01R 31/3177* (2006.01)
*G06F 11/22* (2006.01)
*G06F 11/267* (2006.01)

(52) U.S. Cl.
CPC ...... *G06F 11/3656* (2013.01); *G01R 31/3177* (2013.01); *G01R 31/31705* (2013.01); *G06F 11/263* (2013.01); *G06F 11/3636* (2013.01); *G06F 11/2242* (2013.01); *G06F 11/267* (2013.01)

(58) Field of Classification Search
CPC .............. G06F 11/3656; G06F 11/263; G06F 11/3636; G06F 11/267; G01R 31/31705; G01R 31/3177
See application file for complete search history.

(56) References Cited

U.S. PATENT DOCUMENTS

| | | | |
|---|---|---|---|
| 5,978,902 A * | 11/1999 | Mann | G06F 11/348 712/227 |
| 6,728,906 B1 * | 4/2004 | Case | G06F 11/348 714/30 |
| 6,779,145 B1 | 8/2004 | Edwards et al. | |
| 7,152,186 B2 * | 12/2006 | Airaud | G06F 11/2242 714/30 |
| 7,631,128 B1 * | 12/2009 | Sgrosso | G06F 3/06 709/203 |
| 7,681,078 B2 | 3/2010 | Moyer et al. | |
| 8,683,265 B2 * | 3/2014 | Rentschler | G06F 11/3656 714/30 |
| 8,825,922 B2 * | 9/2014 | Mayer | G06F 11/3476 710/22 |
| 9,003,232 B2 | 4/2015 | Hopkins | |

(Continued)

FOREIGN PATENT DOCUMENTS

EP 1089174 4/2001

*Primary Examiner* — Paul Contino
(74) *Attorney, Agent, or Firm* — Kilpatrick Townsend & Stockton LLP

(57) ABSTRACT

An integrated circuit can include a functional unit and a local debug unit. The local debug unit can include a trace buffer, and the local debug unit is configured to track and store operation information of the functional unit in the trace buffer. The integrated circuit can also include a global debug unit coupled to the local debug unit. The integrated circuit is configured to send a debug reset command to reset the functional unit, without sending the debug reset command to the local debug unit, thereby retaining information stored in the trace buffer. The integrated circuit is also configured to send a power-up reset command to reset the local debug unit and the functional unit, thereby causing the local debug unit to clear the trace buffer.

18 Claims, 14 Drawing Sheets

(56) References Cited

U.S. PATENT DOCUMENTS

| | | | | |
|---|---|---|---|---|
| 9,009,541 B2* | 4/2015 | Gulati | ............... | G06F 11/22 |
| | | | | 714/45 |
| 9,063,915 B2 | 6/2015 | Usui et al. | | |
| 9,424,166 B2 | 8/2016 | Hopkins et al. | | |
| 9,442,815 B2* | 9/2016 | Nixon | ............... | G06F 11/27 |
| 2005/0034017 A1* | 2/2005 | Airaud | ............... | G06F 11/2242 |
| | | | | 714/25 |
| 2007/0255935 A1* | 11/2007 | Agarwala | ............... | G06F 11/3636 |
| | | | | 713/1 |
| 2009/0158075 A1* | 6/2009 | Biberstein | ............... | G06F 1/12 |
| | | | | 713/375 |
| 2009/0282294 A1* | 11/2009 | Edwards | ............... | G06F 11/3636 |
| | | | | 714/45 |
| 2010/0281308 A1* | 11/2010 | Xu | ............... | G06F 11/3636 |
| | | | | 714/45 |
| 2012/0144240 A1* | 6/2012 | Rentschler | ............... | G06F 11/3636 |
| | | | | 714/34 |
| 2014/0047262 A1* | 2/2014 | Nixon | ............... | G06F 1/10 |
| | | | | 713/400 |
| 2014/0068345 A1* | 3/2014 | Miller | ............... | G06F 11/3636 |
| | | | | 714/45 |

* cited by examiner

MULTIPLE RESET TYPES IN A SYSTEM

BACKGROUND

Modern system-on-chips (SoCs) and other integrated circuits (ICs) are becoming increasingly complex. Debug of these complex ICs is extremely challenging due to system complexity. Performance monitor units and debug units, such as hardware performance monitors and debuggers, can be used in ICs to gather data regarding the operations performed by the ICs. Compared to software profilers, hardware performance monitors and debuggers provide low-overhead access to detailed performance and debug information related to functional blocks of the ICs such as central processing unit (CPU), network, caches and main memory.

BRIEF DESCRIPTION OF THE DRAWINGS

Various embodiments in accordance with the present disclosure will be described with reference to the drawings, in which.

DETAILED DESCRIPTION

Figure 1:
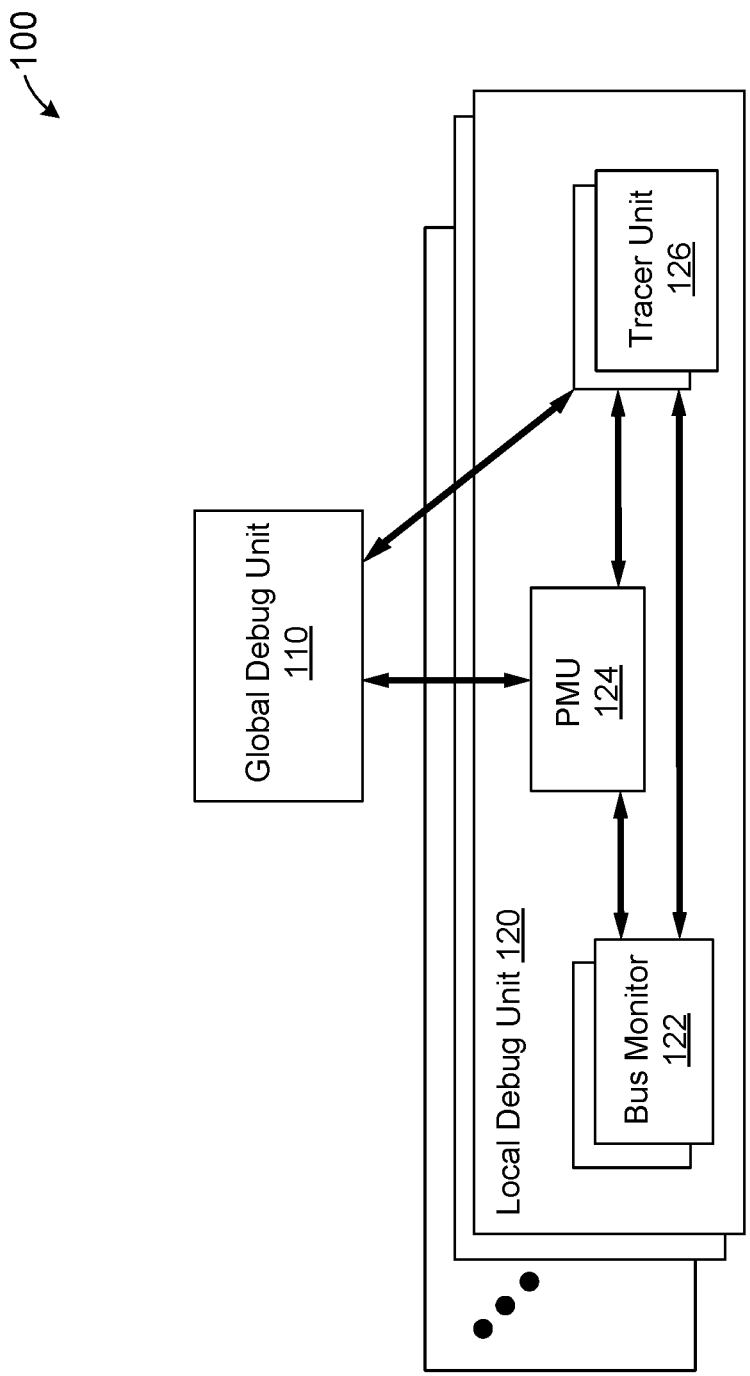
FIG. 1 illustrates a block diagram of a distributed debugging subsystem according to certain aspects of the disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

In a complex electronic circuit, such as a system-on-chip (SoC), an erroneous behavior may trigger a chip-reset. For example, an SoC on a Peripheral Component Interconnect Express (PCIe) card may fail and needs to be reset before any debugging can be carried out. In conventional systems, the reset operation may erase information regarding the events leading to the failure, making it difficult to debug the failure. Techniques described herein include methods and systems for retaining debug information accumulated before the reset, such that after the system is restarted, the information can be used for debugging. For example, a system can have a distributed debug system having multiple debug units, each associated with a respective functional unit in the system. The debug units monitor the performance of the functional unit and have a trace buffer to store relevant performance and debug information. The system distinguishes between, for example, two types of resets. In a power-up reset, all the debug units' resources are reset along with the resources of the functional units. However, in a debug reset, the information stored in the debug unit trace buffer is retained. The scenario leading to the system reset may be logged in the trace buffer prior to the system reset event, and be interrogated and debugged later on once the system is reinitialized. Further, an external debugger can review the debug unit snapshots logged prior to the reset sequence. In some cases, the tracer buffer can include SRAM (static random access memory) for storing the information, removing the need for non-volatile memories, which are more costly to integrate within an SoC. In some embodiments, each debug unit can have a local time stamp counter operating in a local time domain. The local time stamp counter is aligned to a global time stamp counter in a global debug unit. The alignment can be carried out using two one-bit commands: clear and increment. Therefore, the synchronization interface overhead can be reduced.

Some embodiments of the disclosed technologies provide a system that includes a processor, a memory coupled to the processor, and a PCIe card coupled to the processor. The PCIe card includes multiple functional units and a debug unit associated with each functional unit. The debug unit is configured to track events and monitor performance of the respective functional unit. The debug unit has a trace buffer that includes an SRAM for storing processing state of the respective functional unit. Upon detection of a PCIe card error condition, the processor is configured to issue a debug reset command to reset each functional unit of the PCIe card without issuing the reset command to the debug units of the respective functional units, thereby retaining information for each of the functional units stored in the respective trace buffers to be read by the processor for debugging the PCIe card error condition after reset. Further, each debug unit is configured to, upon receiving a reset command from the processor, clear information stored in the respective trace buffer.

Some embodiments of the disclosed technologies provide an SoC that includes a plurality of functional units. Each functional unit has a local debug unit. Each local debug unit has a trace buffer, and is configured to track and store operation information of a respective functional unit in the trace buffer. The SoC also has a global debug unit coupled to each local debug unit. The global debug unit operates as a central cross triggering matrix for the local debug units for triggering reset of the trace buffers or synchronizing clocks for each or any of the local debug units. In certain embodiments, the SoC is configured to provide a debug reset command to reset each of the functional units, without directing the debug reset command to the associated local debug unit, thereby retaining the information stored in the trace buffer. The SoC is also configured to provide a power-up reset command to reset the local debug unit and the functional unit, thereby causing the debug unit to clear the trace buffer.

Some embodiments of the disclosed technologies provide an IC that can include a functional unit and a local debug unit. The local debug unit can include a trace buffer, and the local debug unit is configured to track and store operation information of the functional unit in the trace buffer. The IC can also include a global debug unit coupled to the local debug unit. The IC is configured to send a debug reset command to reset the functional unit, without sending the debug reset command to the local debug unit, thereby retaining information stored in the trace buffer. The integrated circuit is also configured to send a power-up reset command to reset the local debug unit and the functional unit, thereby causing the local debug unit to clear the trace buffer.

Some embodiments of the disclosed technologies provide methods for handling multiple types of reset in a system. During execution of operations in a functional unit in a system, the processing state of the functional unit is stored in a trace buffer in a debug unit of the functional unit. The processing state is associated with execution of operations in the functional unit. After receiving a reset command, the debug unit determines whether the reset command is a debug reset command or a power-up reset command. If the reset command is a debug reset command, the information stored in the trace buffer is retained, and the functional unit is reset. If the reset command is a power-up reset command, the trace buffer is cleared, and the functional unit is reset.

FIG. 1 illustrates a block diagram of a distributed debugging subsystem according to certain aspects of the disclosure. As shown in FIG. 1, a distributed debugging system 100 includes a global debug unit 110 and multiple local debug units 120. Distributed debugging system 100 can be implemented in an SoC or an IC of a computer system to provide a flexible hierarchical event tracking and logging system, enabling local tracking/tracing of operations performed by functional units of the SoC/IC as well as cross-triggering mechanisms between the global debug unit 110 and the local debug units 120. The distributed debugging system 110 is set at power-up and enables tracking and logging of information for the multiple functional units. The global debug unit 110, which in some embodiments is also referred to as a central cross-triggering matrix (CCTM), is configured to coordinate the operations of local debug units 120. Cross triggering between different local debug units could facilitate hardware debugging through correlations between events occurring in one functional block and events occurring in another functional block or correlations between different events. In an embodiment, each local debug unit 120 can include a bus monitor unit 122, a performance monitor unit (PMU) 124, and a logic analyzer and tracer unit 126. Each of the above components is described in more detail below.

Figure 2:
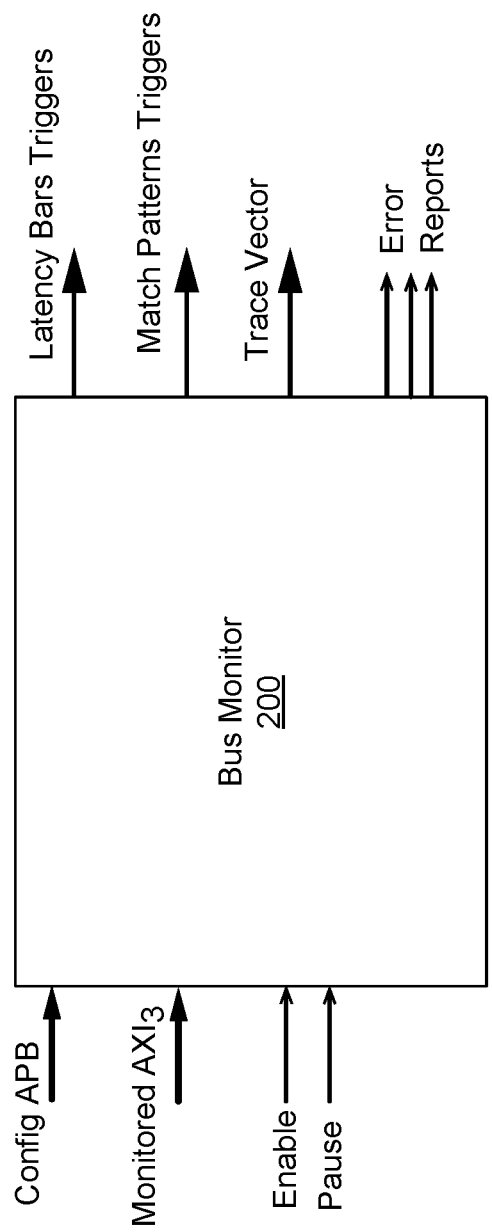
FIG. 2 illustrates a block diagram of a bus monitor unit in a debug unit according to certain aspects of the disclosure.

FIG. 2 illustrates a block diagram of a bus monitor unit in a local debugging unit according to certain aspects of the disclosure. As illustrated in FIG. 2, a bus monitor unit 200 is an example of the bus monitor unit 122 in distributed debugging system 100 in FIG. 1. Bus monitor unit 200 is configured to track/monitor read or write bus transactions. In some embodiments, bus monitor unit 200 is configured to monitor the AXI bus interface as defined in the ARM Advanced Microcontroller Bus Architecture (AMBA®). The term "AXI" stands for Advanced eXtensible Interface and is targeted at high performance, high clock frequency system designs and includes features that make AXI suitable for high speed sub-micrometer interconnect.

Bus monitor unit 200 can include the several features for monitoring the traffic. For example, in some embodiments, bus monitor unit 200 can monitor transactions using several different latency windows. Monitoring transactions in different latency windows allows for monitoring across different distribution ranges of latencies for generating latency histograms related to the transactions. The transactions per latency window may be reported to a performance monitor unit (PMU), e.g., PMU 124 in FIG. 1 for tracking and histogram generation. Bus monitor unit 200 can be provisioned to monitor all or specific transactions in the latency windows. In certain embodiments, specific transactions may be monitored using a screening scheme described below. Bus monitor unit 200 can be configured to check and log the maximal latency transaction detected at any given point in time, to periodically check for timeout (hanging) transactions, and to report events through the local interrupt controller. In an embodiment, bus monitor unit 200 can have configuration input signals (e.g., Config-APB (Advanced Peripheral Bus)) for configuring the bus monitor unit 200, Monitored AXI3 for tracking AXI3 style bus, Enable for enabling the bus monitor unit 200, and Pause for temporarily stopping the bus monitor unit 200. Bus monitor unit 200 can also have output signals that include triggers (e.g., Latency Bars Triggers for reporting events based on latency of transactions, Match Patterns Trigger for reporting events based on matching of patterns associated with transaction, etc.), Trace Vector snapshots of bus monitor unit 200 operations, and Error Reports for reporting error conditions.

Bus monitor unit 200 can be configured with several screening schemes for matching transaction attributes for transactions based on selected masks and trigger events. Furthermore, Bus monitor unit 200 can be equipped with a trace vector generation scheme for taking a snapshot of any of the above tracked/screened events, to be then forwarded for a tracing log at the Tracer unit 126 in FIG. 1. In an example, the traces are 128 bits long and can include transaction fields and the transaction tracking information. Bus monitor unit 200 also has provisions for latency checks to be performed using a common central time-stamping system or local clock count. Bus monitor unit 200 can also perform central and local event tracking, clearing or starting-over of events, as needed.

Figure 3:
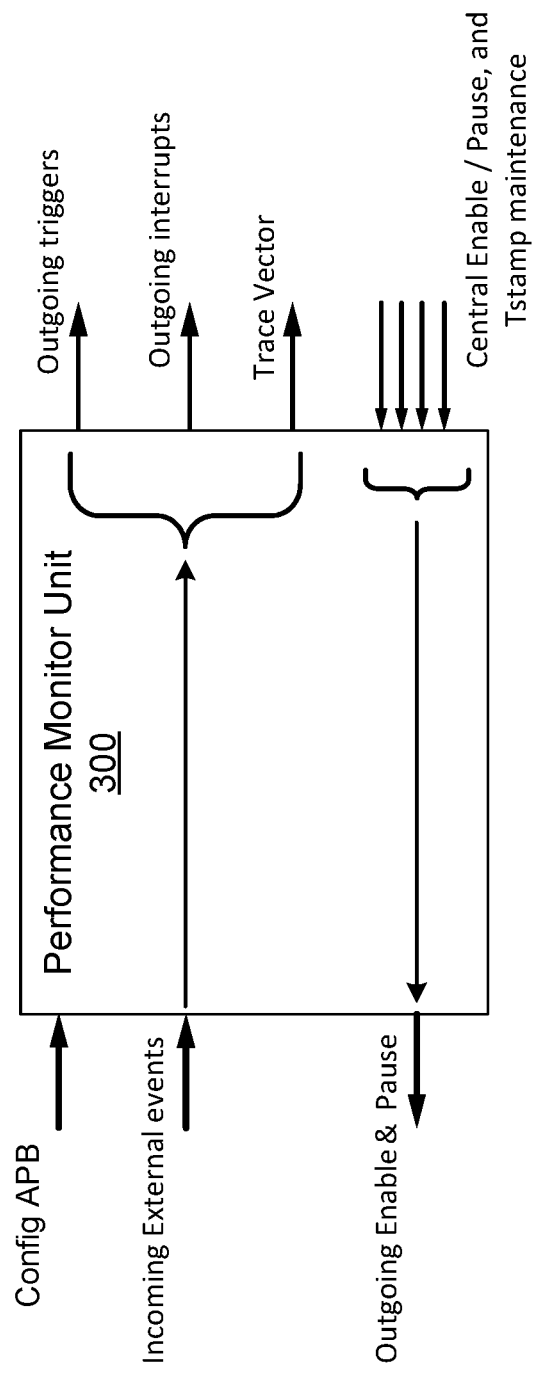
FIG. 3 illustrates a block diagram of a performance monitor unit in a debug unit according to certain aspects of the disclosure.

FIG. 3 illustrates a block diagram of a performance monitor unit in a debug unit according to certain aspects of the disclosure. As illustrated in FIG. 3, a performance monitor unit (PMU) 300 is an example of the performance monitor unit 124 in distributed debugging system 100 in FIG. 1. Performance monitor unit (PMU) 300 is set for tracking incoming event triggers, either for existing or incoming events (e.g., byte count sum for bandwidth calculations). In some embodiments, PMU 300 can support a configurable number of event counters. In certain embodiments, the default number of counters may be a certain number, such as 16 that may be re-configured to up to 32 counters, with each counter having up to 64 bits.

PMU 300 can have, for example, up to 64 external event triggers serving the real incoming events. It can have 64 slots allocated to external triggers and 64 slots are allocated to internal triggers. It can include provisions for recursive rerouting of one event counter to become a trigger to a second event counter, and so on. A trigger can be assigned to more than one event counter, in case different thresholds are needed.

PMU 300 can support window periodical accounting balance checks for violation/statistics, reports violation (overflow and/or underflow) vs. pre-programmed thresholds, and generate interrupt, trigger, or GPIO (General-purpose input/output) indication reports to be sent upstream to the global debug unit for cross triggering. For example, a triggering event from the PMU 300 from one local debug unit may be sent to the global debug unit. In turn, the global debug unit may further trigger all or a subset of the other local debug units in the system for full or partial resets of the respective debug information. In certain embodiments, the information, including interrupts, triggers or GPIO indication reports from multiple PMUs, may be merged together for generating a single system interrupt, trigger, report, etc. PMU 300 can also accept downstream enable/pause indications from the global debug unit and operate based on the configured policy, potentially propagating these downstream to the local bus monitors or trigger sources. PMU 300 can also issue local cross triggering (inferred pause) to the local event trigger sources, using a local cross matrix reference. This may save the unknown time of triggering upstream and getting back the inferred pause downstream, while the window count and event logging is still in progress.

During functional reset, PMU 300 does not log new information, due to the possibility that triggering units may be noisy and unpredictable while under functional reset. However, its contents are maintained through the reset period, to be debugged/interrogated, as needed. PMU 300 can also have provision for blocking any new triggers after the next reset sequence detection, in case the conditions that resulted in this reset sequence are to be debugged.

PMU 300 can generate trace vectors to be sent over to the logic analyzer and trace unit, for tracking periodically selected event counters, enabling a time-line tracking, and histograms to be generated later on. PMU 300 can include provisions for recursive rerouting of one event counter to become a trigger to a second event counter. PMU 300 can also have provisions for delayed enable and delayed pause, provisions for instant enabling or push-off to the next window frame start for suppressing initial conditions (attributed as noise due to a partial window in effect), and provisions for software set of the event triggers, enabling unit level local debugging.

In certain embodiments, the PMU 300 can also be configured for central and local event tracking, clearance or start-over. The PMU 300 can include an interrupt controller equipped with masking schemes for filtering and masking events. The configuration can be handled through the Configuration signal (e.g. Config-APB), with secured access provisions that are centrally enforced.

As shown in FIG. 3, PMU 300 can include input signals Config-APB (or generally configuration signals), incoming external events, central enable and pause signals, and time stamp maintenance signals.

Figure 4:
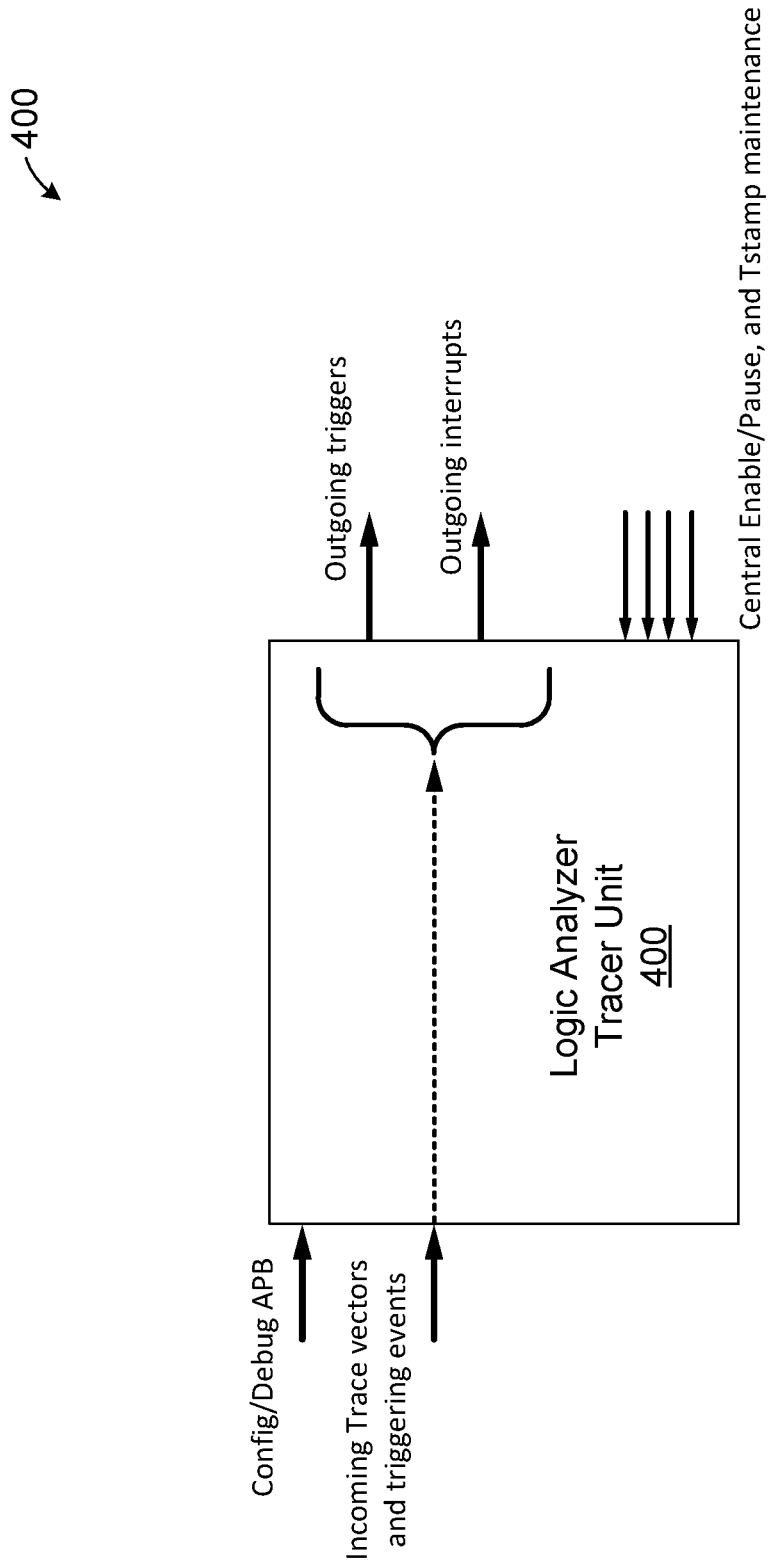
FIG. 4 illustrates a block diagram of a logic analyzer tracer unit in a debug unit according to certain aspects of the disclosure.

FIG. 4 illustrates a block diagram of a logic analyzer tracer unit in a local debug unit according to certain aspects of the disclosure. A logic analyzer and tracer unit 400 in FIG. 4, also referred to as tracer unit 400, is an example of logic analyzer 126 in distributed debugging system 100 in FIG. 1. Logic analyzer and tracer unit 400 is configured to provide low level signal visibility in the computer system and can monitor a multitude of signals to detect the states leading to lock-ups and data corruption. With a CPU, the logic and tracer unit 400 provides visibility into transactions, such as loads, stores, speculative fetches, cache activity and life-cycle of transactions. In some embodiments, logic analyzer and tracer unit 400 can include macros for implementing analyzer and tracer functions, such as ARM ELA500 macros. The logic and tracer unit 400 can enable swift hardware assisted debug of otherwise hard-to-trace issues, including data corruption and dead/live locks.

In some embodiments, logic analyzer and tracer unit 400 can include groups of trace vectors (e.g., up to 12 groups) to be sampled in and processed/traced, and submit upstream triggers to the global debug unit, serving as interrupts, cross trigger, or GPIO indication. The unit 400 also has internal trace buffers. Logic analyzer and tracer unit 400 is configured to track reset events (e.g., assertion and deassertion) for assistance in filtering events during that time. Some of the tracer groups are dedicated to the bus monitor unit traces and the performance monitor unit traces. Trace vectors from the performance monitor unit or bus monitor unit traces could be enabled/paused based on configurations in the performance monitor unit or bus monitor unit. Logic analyzer and tracer unit 400 are also configured to respond to commands for the external trace vectors to be enabled/paused.

As shown in FIG. 4, logic analyzer and tracer unit 400 can include input signals Configuration signals (e.g., Config-APB), incoming external events, central enable and pause signals, and time stamp maintenance signals. Logic analyzer and tracer unit 400 can also have output signals for outgoing triggers and outgoing interrupts, etc. Configuration access is carried out through Config-APB, with secured access provision that is centrally enforced. Logic analyzer and tracer unit 400 can also have SRAM (static random access memories) for storing selected signal groups for later analysis and/or waveform capture over time.

Figure 5:
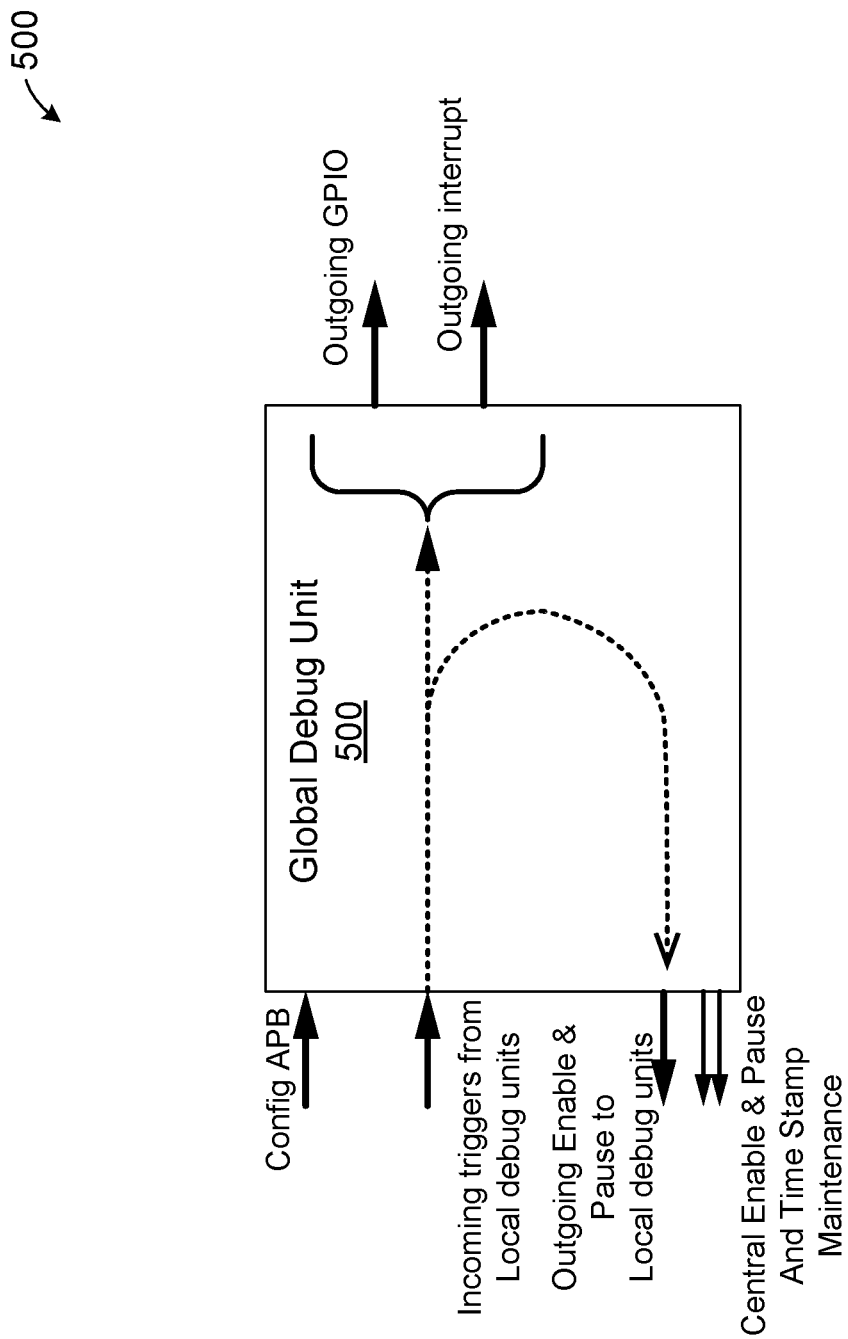
FIG. 5 illustrates a block diagram of a global debug unit according to certain aspects of the disclosure.

FIG. 5 illustrates a block diagram of a global debug unit according to certain aspects of the disclosure. Global debug unit 500 in FIG. 5 is also referred to, in some embodiments, as a PMDTU global or a CCTM (central cross triggering matrix). It is an example of global debug unit 110 in distributed debugging system 100 in FIG. 1. Global debug unit 500 is a central matrix that controls the distribution of trigger requests and associates upstream sent triggers from the performance monitor unit and the tracer unit to control signals downstream to the other performance monitor units and the tracer units in the SoC. It also merges the interrupts and GPIO outwards, according to the local configured policy. As such, it serves as a "social network" informing its subordinates about events in the system.

As a central unit, global debug unit 500 is in charge of providing central enable and clear signals. It is assumed to be located in an independent clock domain, possibly other than the ones in use by the downstream participants, and therefore treats all incoming and outgoing signals as asynchronous. This means full synchronization of the incoming event triggers. In the opposite direction, the performance monitor unit and the tracer unit synchronize all the incoming indications from the global debug unit 500.

As shown in FIG. 5, global debug unit 500 has configuration input signals (e.g., Config-APB) and incoming triggers from local debug units. It also has output signals such as outgoing GPIO, outgoing interrupts, outgoing enable & pause to local debug units, and central enable & pause and time stamp maintenance signals, etc. In some embodiments, global debug unit 500 can have up to 128 sources and destinations, for example, half of which may be for the performance monitor units and the other half for the tracer unit. Global debug unit 500 can include provision for Interrupts/GPIO-indications convergence, Interrupt Controller, provision for delayed enable/pause, and configuration access through Config-APB, with secured access provision that is centrally enforced.

Figure 6:
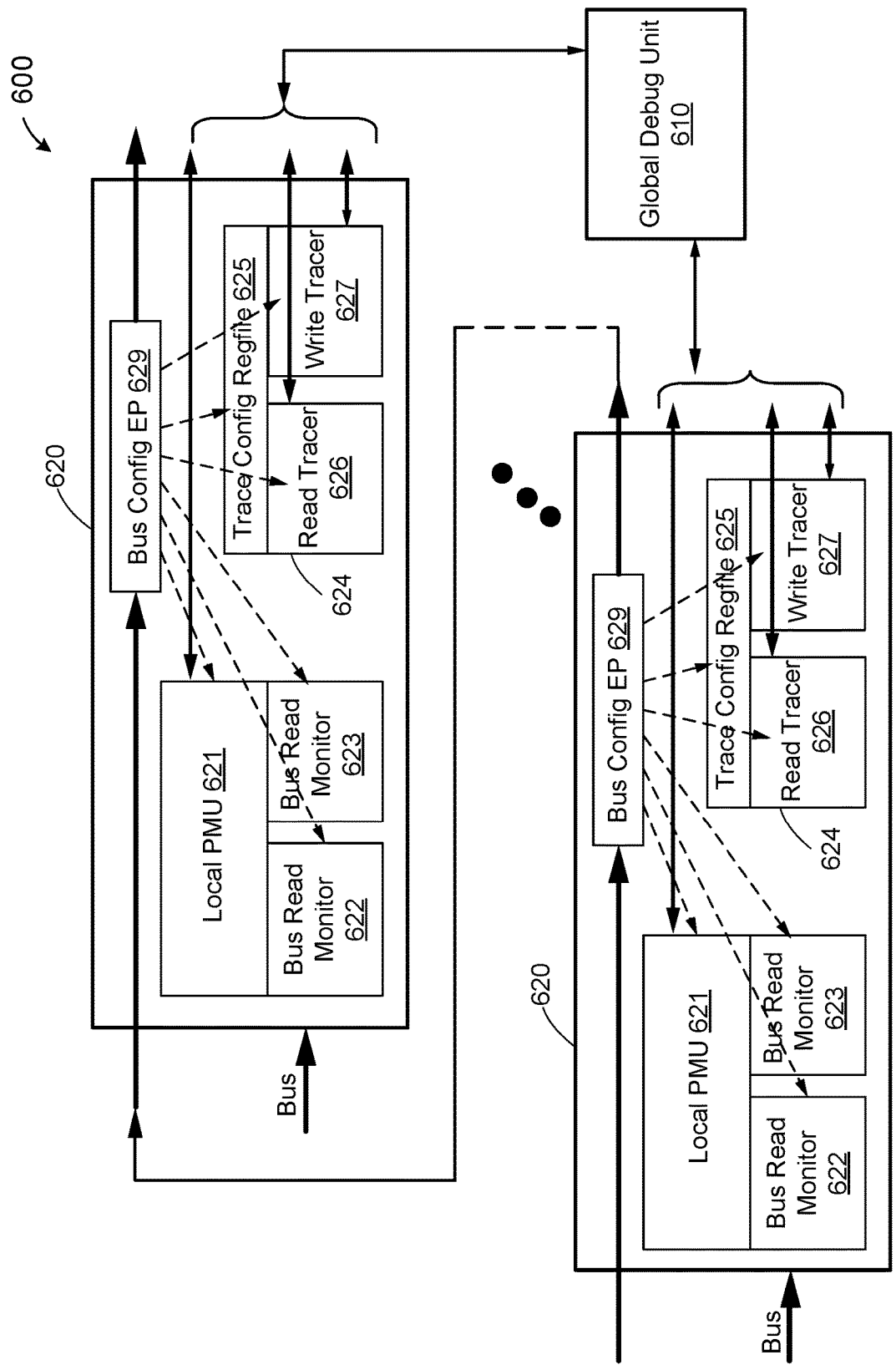
FIG. 6 illustrates a block diagram of a distributed debugging subsystem according to certain aspects of the disclosure.

FIG. 6 illustrates a block diagram of a distributed debugging subsystem according to certain aspects of the disclosure. As shown in FIG. 6, a distributed debugging subsystem 600 a global debug unit 610 coupled to multiple local debug units 620. Similar to the distributed debugging system shown in FIG. 1, distributed debugging system 600 in a computer system provides a flexible hierarchical event tracking and logging system, enabling local tracking/tracing as well as cross-triggering mechanisms. The debugging system is configured at power-up and enables tracking over functional reset events, including logging of information. Local debug units can send triggers upstream, and obey and propagate enable/pause/clear instructions downstream. In the example shown in FIG. 6, each local debug unit 620 can include a local performance monitor unit (PMU) 621, a bus monitor unit split into a bus read monitor unit 622 and a bus write monitor unit 623, and a logic analyzer and tracer unit 624. Logic analyzer and tracer unit 624 includes trace buffers, such as a read tracer 626, a write tracer 627, and a trace configuration end point (EP) file 629. The global debug unit 610 enables cross relations between the above complexes and merged reporting to the SoC level.

In distributed debugging subsystem 600 of FIG. 6, local PMU 621 can include several counters (e.g., 16-32 counters). In a certain implementation of FIG. 6, bus read monitor unit 622 and bus write monitor unit 623 each is equipped with six latency period windows matching event triggers, four screened event matching triggers, and trace vectors for the tracer unit 624. In this configuration, the distributed debugging subsystem 610 has one PMU, two tracers, and two bus monitors (one for read and one for write). Other configurations are also possible that include variations in the number of triggers, counters, buffers, and monitors, without deviating from the scope of the disclosure. For example, in an alternative configuration, the distributed debugging subsystem 600 can include one PMU, one tracer, and no bus monitors. Distributed debugging subsystem 600 can be configured to use a configuration space and internally maps the existing sub modules. Alternatively, the local debug units 620 can be connected in a series chain as shown in FIG. 6.

Figure 7:
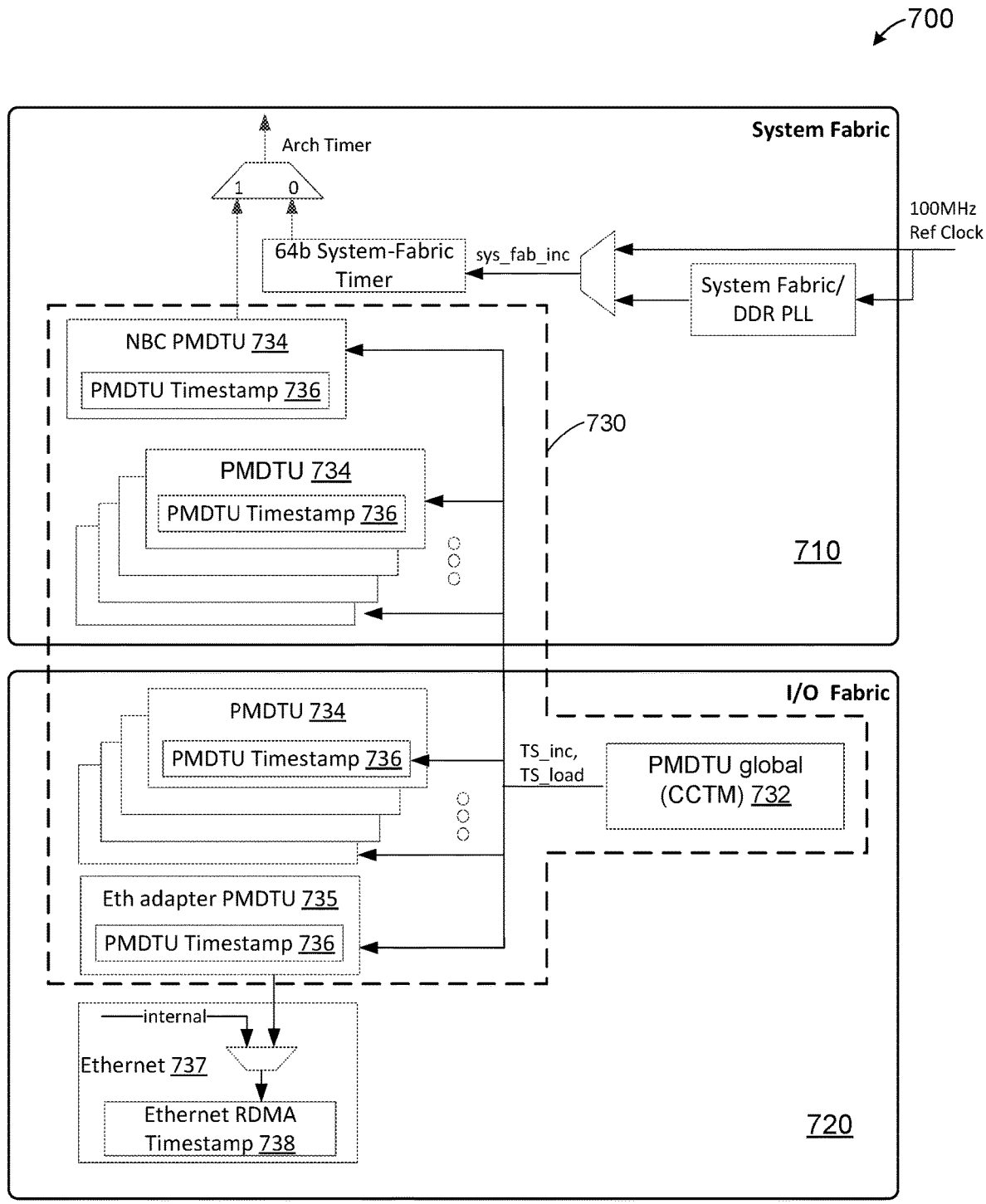
FIG. 7 illustrates a block diagram of a computer system including a distributed debugging subsystem according to certain aspects of the disclosure.

FIG. 7 illustrates a block diagram of a computer system including a distributed debugging subsystem according to certain aspects of the disclosure. As shown in FIG. 7, a computer system 700, e.g., a system-on-a-chip (SoC), a system fabric 710 and an IO fabric 720. Computer system 700 can include multiple system functional units coupled to system fabric 710. Computer system 700 can also include multiple 10 functional units coupled to IO fabric 720.

Computer system 700 includes a distributed debugging subsystem 730. Distributed debugging subsystem 730 includes a number of local debug units 734, each associated with a functional unit coupled to system fabric 710 or IO fabric 720. As described above, a debug unit is also referred to as a performance monitoring, debug, and trace unit (PMDTU). Distributed debugging subsystem 730 also includes a global debug unit 732, which is also referred to as a PMDTU global or a CCTM (central cross triggering matrix). Global debug unit 732 is coupled to each local debug unit in the system fabric and each debug unit in the IO fabric.

Computer system 700 is configured with a timestamp mechanism, in which a global timestamp value is distributed to all local debug units, and helps synchronize the debug information across the SoC. As shown in FIG. 7, each debug unit (PMDTU) 734 has a local PMDTU timestamp counter 736. There is a local debug unit associated with an Ethernet adaptor 735, labeled as Eth adapter PMDTU in FIG. 7, which also includes a local PMDTU timestamp counter 736. The global debug unit, PMDTU global 732 holds the main SoC timestamp generator and issues two commands, timestamp increment (TS_inc) and timestamp load (TS_load), to the local timestamp counters 736 in the local debug units 734. In some embodiments, the timestamp counters are 64-bit counters which are incremented once on each toggle of the TS_inc command. The timestamp counters 636 are reset or loaded with a preset value upon receiving the TS_load command. With this timestamp mechanism, which can be distributed to the entire chip, synchronization can be achieved with two one-bit commands, TS_inc and TS_load, instead of having to repeatedly send long counter values, which can be 64-bit long.

Computer system 700 can also include an Ethernet unit 737 coupled to IO fabric 720. Ethernet unit 737 can have an Ethernet RDMA (remote direct memory access) time stamp counter 738. In an embodiment, the Ethernet RDMA Timestamp Counter has 32 bits, and takes its value from a local PMDTU timestamp counter 736, for example, by taking the least significant 32 bits from the 64-bit PMDTU timestamp counter 736. Using a timestamp as the Arch-timer (system timer) for CPUs and as the Ethernet-RDMA timestamp creates a synchronized debugging system, where all components are aligned. Such alignment between the Ethernet-RDMA and CPU serves also as a latency calculation mechanism, allowing the addition of synchronized timestamp value through the whole loop from CPU to the Ethernet and back to the CPU.

Figure 8:
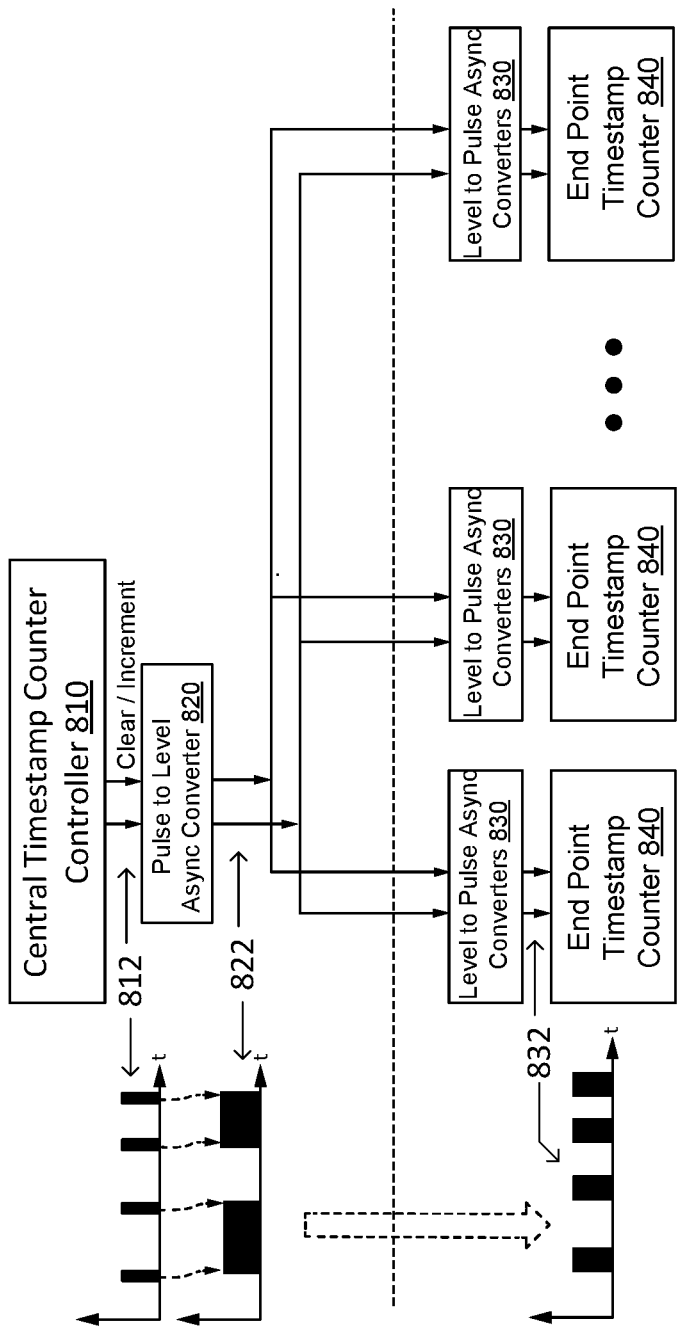
FIG. 8 illustrates a block diagram depicting timestamp control in a computer system including a distributed debugging subsystem according to certain aspects of the disclosure.

FIG. 8 illustrates a block diagram depicting timestamp control in a computer system including a distributed debugging subsystem according to certain aspects of the disclosure. FIG. 8 illustrates the timestamp control distribution from a global debug unit to multiple local debug units. In a system, the global debug unit and local debug units can be in different time domains. The global debug unit has a central timestamp counter controller 810, which provides two signals 812, clear and increment, in the time domain of the global debug unit. Signals 812 are short pulse signals, as shown in the timing diagram on the left side of FIG. 8. The short pulse signals 812 are converted by a pulse to level asynchronous converter 820 to level signals 822. It can be seen in FIG. 8 that a level signal 822 has a rising edge triggered by an 812 signal and a falling edge triggered by the following 812 signal. Signals 822 are driven to a certain level to pulse asynchronous converter 830 in a local debug unit, where signals 822 are converted to short pulse signals 832. It can be seen in FIG. 8 that each of pulse signals 832 is triggered by either a rising edge or a falling edge of level signal 822. Pulse signals 832 in the time domain of a local debug unit can be used as timestamp signals to trigger end point timestamp counters 840 in the local debug units, which generates local time stamp signals in the local time domain.

Figure 9:
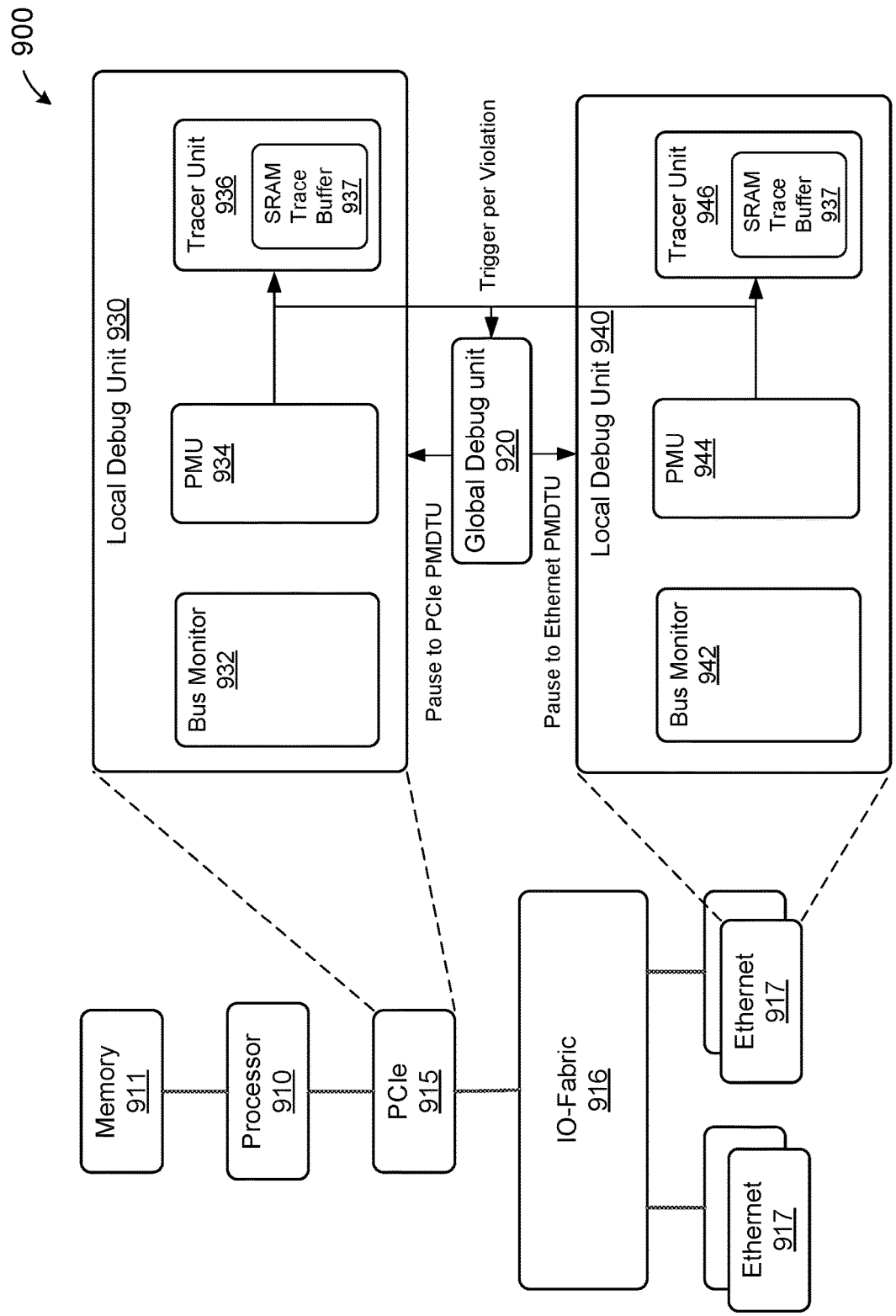
FIG. 9 illustrates a block diagram of a computer system including a distributed debugging subsystem according to certain aspects of the disclosure.

FIG. 9 illustrates a block diagram of a computer system including a distributed debugging subsystem according to certain aspects of the disclosure. As shown in FIG. 9, computer system 900 includes several functional blocks, for example, a processor 910, a memory 911, a PCIe unit 915, an IO fabric 916, and network interface units 917, such as Ethernet units. Memory 911 and PCIe unit 915 are coupled to processor 910. PCIe unit 915 and Ethernet units 917 are coupled to IO fabric 916. In some embodiments, these functional blocks can be coupled to a mother board. In some embodiments, system 900 can be a system-on-a-chip (SoC). For example, system 900 can represent a PCIe card.

Computer system 900 also includes a distributed debug system that includes a global debug unit 920, also referred to as a CCTM, and multiple local debug units. Each local debug unit can be associated with a functional block. For example, a local debug unit 930 is associated with PCI2 unit 915, and local debug unit 940 is associated with an Ethernet unit 917. Local debug unit 930 and local debug unit 940 are similar to the local debug units described above in connection to FIGS. 1-6. For example, local debug unit 930 includes a bus monitor unit 932, a performance monitor unit (PMU) 934, and a logic analyzer and tracer unit 936. Similarly, local debug unit 940 includes a bus monitor unit 942, a performance monitor unit (PMU) 944, and a logic analyzer and tracer unit 946. Further, tracer unit 936 includes a trace buffer 937, and tracer unit 946 can include a trace buffer 947. In some embodiments, both tracer buffers 937 and 938 can include SRAM (static random access memory).

When an exception event is detected, local debug units 930 and 940 are configured to send an exception trigger signal to the global debug unit 920. Central debug unit 920 generates a pause trigger to both local debug unit 930 associated with PCIe unit 915 and local debug unit 940 associated with Ethernet unit 917. Pre-defined bus signaling including address, controls, attributes, data, etc., is logged in trace buffers in tracer units 936 and 946.

In some debug cases, a system event may cause an erroneous behavior leading to a chip-reset or a power-up reset. In such cases, the debug information persistence is necessary in order to debug the faulty behavior after the chip overcomes a chip-reset and returns to normal operation, such as in a scenario in which a stuck PCIe card causes a problem, and will be reset before any debugging is done. In this case, the debug information needs to be preserved across the reset.

In some embodiments, the system distinguishes between two types of resets. In a power-up reset, all the debug units resources are reset. However, a debug reset, also referred to as a functional reset, is treated as an event, but not as a reset to the local resources in the debug units. This enables tracking and debugging across reset sequences. In other words, a scenario leading to a system reset may be logged prior to the system reset event, and be interrogated and debugged later on once the system is reinitialized, and the external debugger reviews the debug unit snapshots logged prior to the reset sequence. Moreover, the reset event itself can be logged and used to distinguish events that happened before and after its occurrence.

As shown in FIG. 9, a Peripheral Component Interconnect Express (PCIe) unit 915 is coupled to processor 910. PCIe unit 915 has a local debug unit 930 that is configured to track events and monitor performance of the PCIe unit 915. Debug unit 930 includes a trace buffer 937 having a static random access memory (SRAM). Debug unit 930 is configured to handle two types of reset command. Upon receiving a debug reset command from the processor 910, debug unit 930 retains information about the processing state of the PCIe unit 915 and stores the information in the SRAM of the trace buffer 937. Upon receiving a power-up reset command from the processor 910, debug unit 930 clears the processing states of the functional unit without storing the information about the processing state of the debug unit 930.

Therefore, the system provides two types of resets, a power-up reset, which is also referred to as a normal reset, and a debug reset, which is also referred to as a functional reset. With the power-up reset, everything in the system is reset, and with the debug reset, everything is reset except the debug information. If a hang condition of the PCIe unit is detected, a debug reset command is issued, and all the process state information that has been stored and logged in the debug unit is preserved. The information can be recovered and, for example, used to track down the sequence of events that led to the hang scenario. The problem can be fixed, and the system can be restarted. The information about the processing state of the PCIe unit can include inbound and outbound transactions going through the PCIe unit.

Figure 10:
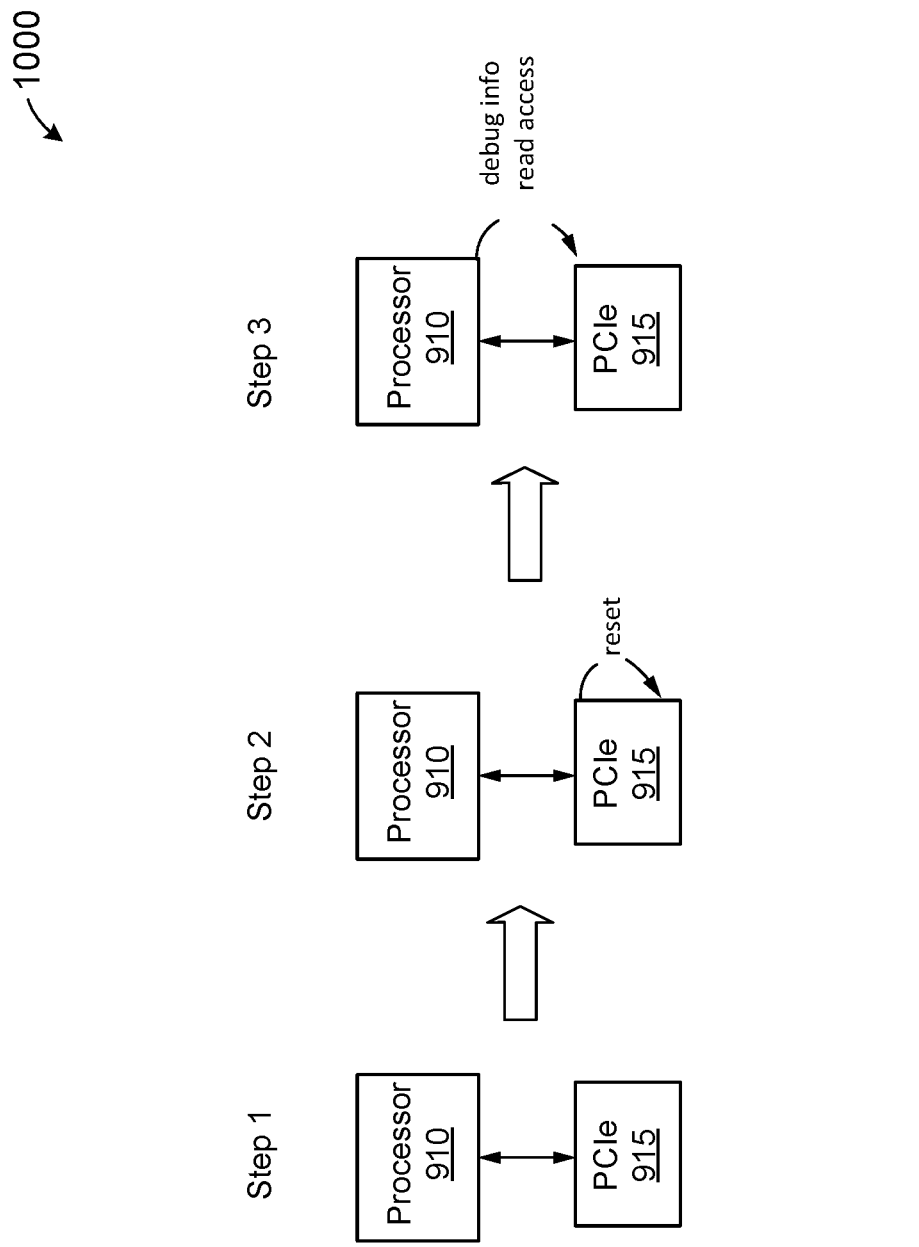
FIG. 10 illustrates a block diagram depicting the handling of multiple reset signals in a computer system according to certain aspects of the disclosure.

FIG. 10 illustrates a block diagram 1000 depicting multiple reset signals handling in a computer system according to certain aspects of the disclosure. FIG. 10 shows part of computer system 900 in FIG. 9, which includes several functional blocks, for example, a processor 910, a memory 911, a PCIe unit 915, an IO fabric 916, and network interface units 917, such as Ethernet units. Memory 911 and PCIe unit 915 are coupled to processor 910. PCIe unit 915 and Ethernet units 917 are coupled to IO fabric 916. In some embodiments, system 900 can represent a PCIe card. In addition, system 900 can be implemented as a system-on-a-chip (SoC). The reset scenario described above is illustrated in FIG. 10, which, for simplicity, only shows processor 910 and PCIe unit 915. In Step 1, it is discovered that the PCIe unit 915 has encountered errors or is not responding. In Step 2, upon detection of a PCIe unit error condition, the processor is configured to issue a debug reset command to reset each functional unit, without issuing the debug reset command to the debug unit, thereby retaining information stored in the trace buffer SRAM to be read by the processor for debugging the PCIe card error condition. The system preserves process state and debug information, and recovers back to a working state. In Step 3, the debug information is read and used for trouble shooting.

In some embodiments, the debug reset may be part of a self-reset operation, or the reset command may be received from another management entity. In certain embodiments, the debug vs. non-debug might just be a configuration. If an error is encountered, the same software can be run again after configuring the system in debug mode, and the PCIe card would encounter the error and do a debug reset instead of a power-up reset, so that the system can be debugged.

Figure 11:
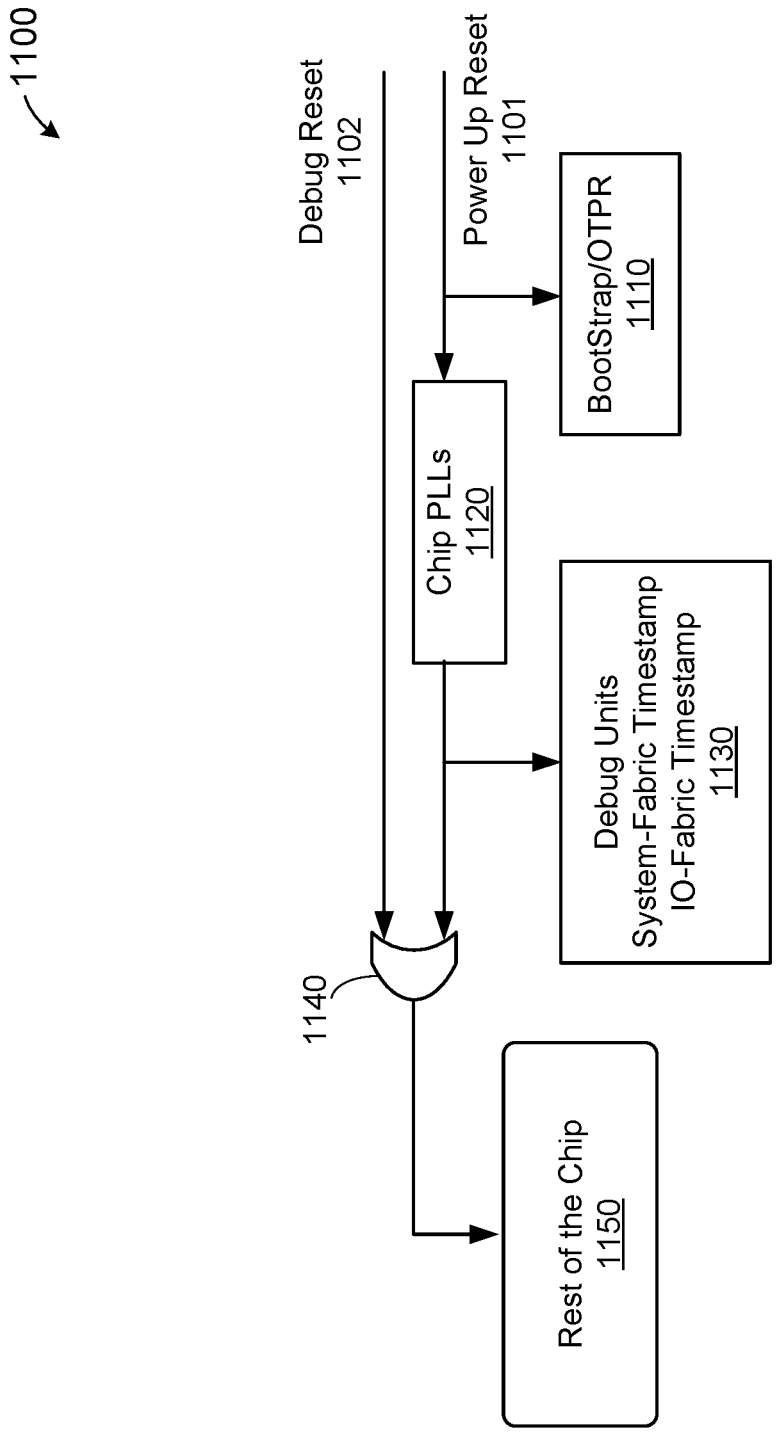
FIG. 11 illustrates a block diagram of the handling of multiple reset signals according to certain aspects of the disclosure.

FIG. 11 illustrates a schematic diagram of multiple reset signals handling according to certain aspects of the disclosure. As shown in FIG. 11, a reset signal handling circuit 1100 includes signal paths for two reset signals: a power-up reset signal 1101 and a debug reset signal 1102. The power-up signal 1101 activates a block 1110 for bootstrap and OTPR (one time programmable read-only memory) for system configuration information needed to restart the system after the power-up reset. The power-up signal 1101 is passed through chip phase-locked-loop (PLL) block 1120 for synchronization to the local clock domain. The synchronized power-up signal resets block 1130, which includes the debug units, the system-fabric timestamp circuits, and the IO-fabric timestamp circuit. After passing through a logic OR block 1140, the power-up reset signal resets the rest of the chip 1150. In contrast, with the debug reset signal 1102, information about the debug units, the system-fabric timestamp circuits and the IO-fabric timestamp circuit is preserved, and only the rest of chip 1150, including the functional units, is reset.

In some embodiments, FIG. 11 illustrates reset signal paths in a system-on-a-chip (SOC), which can include a plurality of debug units 1130, each being associated with a respective functional unit. The "rest of the chip" block 1150 can include the functional units. In this case, the system can provide two types of reset signals, the debug reset signal and the power-up reset signal. The system directs the power-up reset signal to the debug units and the functional units for reset operations. However, the debug reset signal is directed to the functional units, and not the debug units.

In some embodiments, the power-up reset command can be initiated outside the SoC. The SoC can issue a debug reset command if a functional unit fails. In some other embodiments, the SoC can be configured to distinguish whether a reset signal is a power-up reset signal or a debug reset signal. In this case, the SOC identifies the type of the reset signal and takes actions as described above. In still other embodiments, the functional unit or the debug unit can be configured to distinguish whether a reset signal is a power-up reset signal or a debug reset signal.

Figure 12:
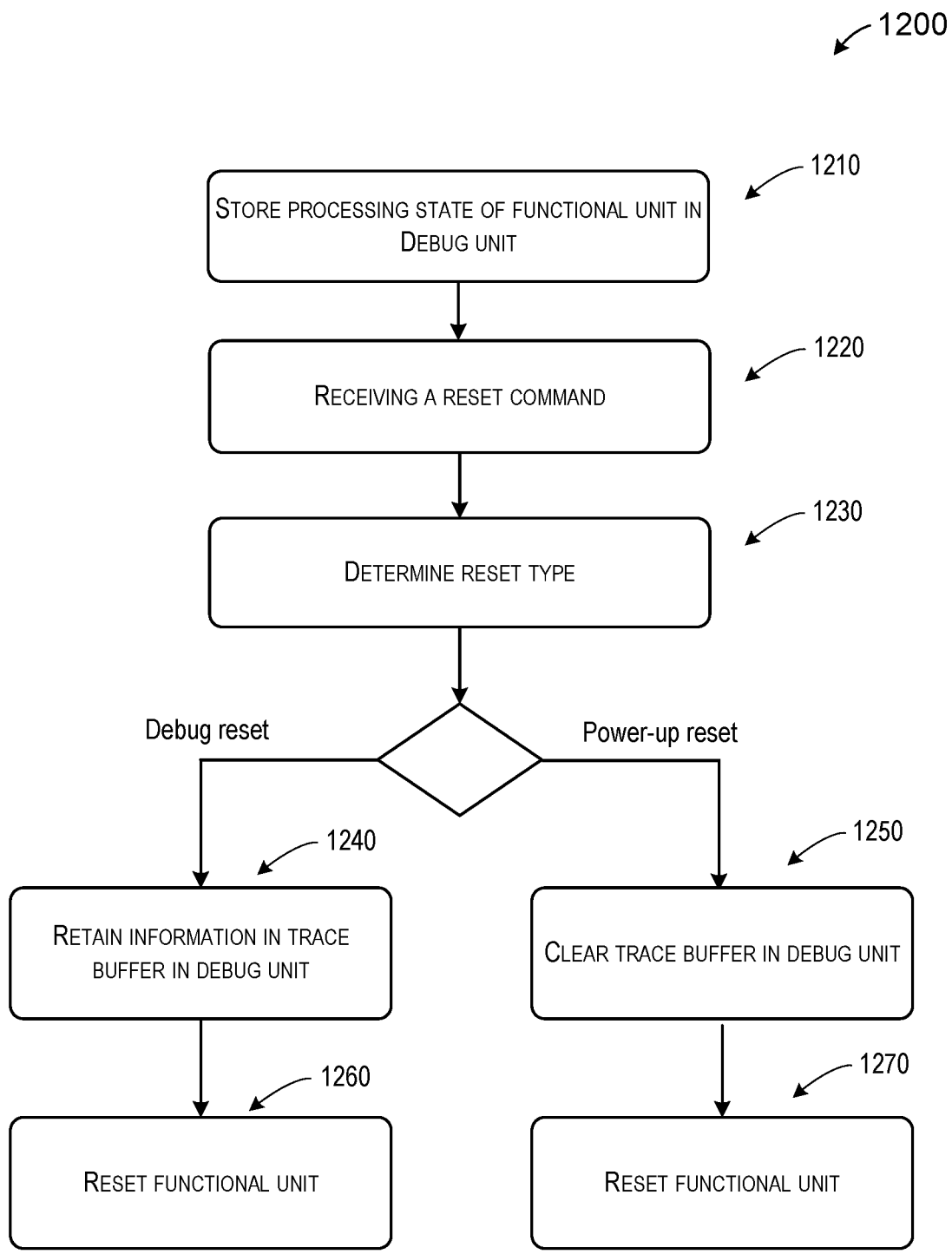
FIG. 12 is a flowchart illustrating an example of a method for handling multiple reset types in a system.

FIG. 12 is a flowchart illustrating an example of a method for handling multiple reset types in a system. This method may be implemented using the systems described above in, for example, FIGS. 1-11. Method 1200 of FIG. 12 describes multiple reset types in a system having a number of functional units, and each functional unit can have a debug unit associated with it. Examples of the system are described above in connection with FIGS. 7-11. For example, computer system 700 in FIG. 7 includes multiple functional units and a distributed debugging subsystem 730. The debugging subsystem 730 includes a number of local debug units 734, each associated with a functional unit. The distributed debugging subsystem 730 also includes a global debug unit 732 coupled to each local debug unit. As another example, computer system 900 in FIG. 9 includes several functional blocks, for example, a processor 910, a memory 911, a PCIe unit 915, an IO fabric 916, and Ethernet units 917. Each functional block can be associated with a local debug unit. Examples of the debug unit are described above in connection with FIGS. 1-6. For example, in FIG. 9, local debug unit 940 includes a bus monitor unit 942, a performance monitor unit (PMU) 944, and a logic analyzer and tracer unit 946. Further, tracer unit 946 can include a trace buffer 947. In some embodiments, tracer buffer 938 can include SRAM (static random access memory).

As shown in method 1200 of FIG. 12, at 1210, during execution of operations in a functional unit in the system, the debug unit is configured to store the processing state of the functional unit in a trace buffer in the debug unit. The execution of operation can include software instructions or hardware logical operations using various gates and circuits. The processing state is associated with execution of operations in the functional unit, for example, receiving a reset command in the debug unit. During normal operation of a functional unit, the debug unit can track events and monitor performance of the functional unit. The debug unit also stores relevant information in a trace buffer, which, for example, can include SRAM.

Referring to FIG. 9, when an exception event is detected, local debug units 930 and 940 are configured to send an exception trigger signal to the global debug unit 920. Global debug unit 920 generates a pause trigger to both local debug unit 930 associated with PCIe unit 915 and local debug unit 940 associated with Ethernet unit 917. Pre-defined bus signaling including address, controls, attributes, data, etc., is logged in trace buffers in tracer units 936 and 946.

In an exception or error condition, the system may issue a reset command. In method 1200 of FIG. 12, at 1220, the reset command is received. At 1230, it is determined whether the reset command is a debug reset command or a power-up reset command. Depending on the embodiments, the reset command can be received at different parts of the system. For example, in some embodiments, the functional unit in the system can receive the reset command and determine whether the reset command is a debug reset command or a power-up reset command. In some other embodiments, the debug unit receives the reset command. In this case, the debug unit determines whether the reset command is a debug reset command or a power-up reset command. In still other embodiments, the system can receive two types of reset command, a debug reset command and a power-up command.

At 1240, if the reset command is a debug reset command, the debug unit retains information stored in the trace buffer. For example, the trace buffer of the debug unit can include a static random access memory (SRAM) for storing the processing state of the functional unit, e.g., PCIe unit 915. At 1260, the functional unit is reset and can be restarted. The information is stored in the trace buffer SRAM to be read by the processor for debugging the functional unit error condition.

At 1250, if the reset command is a power-up reset command, the debug unit clears the trace buffer. At 1270 the processing state of the functional unit is cleared to reset the functional unit.

In some embodiments, the system can include a time stamp mechanism as described in connection with FIGS. 7 and 8. In these cases, method 1200 also includes synchronizing a local time stamp counter in the debug unit to a time stamp counter in a global debug unit. The local time stamp information is stored in the trace buffer of the debug unit, and the stored time stamp information is retained across a debug reset.

Figure 13:
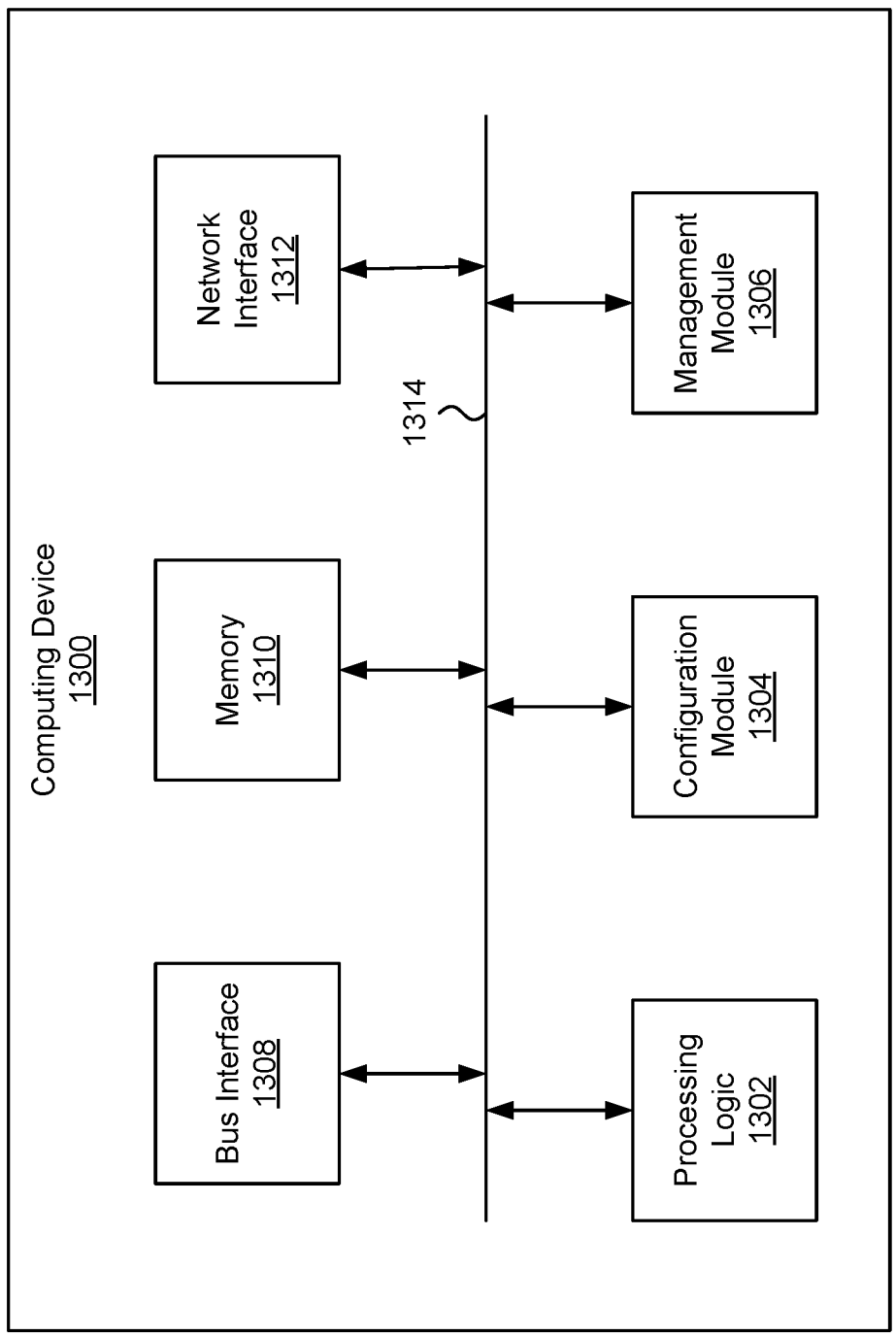
FIG. 13 illustrates an example of a computing device, according to certain aspects of the disclosure.

FIG. 13 illustrates an example of a computing device 1300. Functionality and/or several components of the computing device 1300 may be used without limitation with other embodiments disclosed elsewhere in this disclosure, without limitations. Computing device 1300 may facilitate processing of packets and/or forwarding of packets from the computing device 1300 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 1300 may be the recipient and/or generator of packets. In some implementations, the computing device 1300 may modify the contents of the packet before forwarding the packet to another device. The computing device 1300 may be a peripheral device coupled to another computer device, a switch, a router or any other suitable device enabled for receiving and forwarding packets.

In one example, the computing device 1300 may include processing logic 1302, a configuration module 1304, a management module 1306, a bus interface module 1308, memory 1310, and a network interface module 1312. These modules may be hardware modules, software modules, or a combination of hardware and software. In certain instances, modules may be interchangeably used with components or engines, without deviating from the scope of the disclosure. The computing device 1300 may include additional modules, not illustrated here, such as components discussed with respect to the nodes disclosed in FIG. 14. In some implementations, the computing device 1300 may include fewer modules. In some implementations, one or more of the modules may be combined into one module. One or more of the modules may be in communication with each other over a communication channel 1314. The communication channel 1314 may include one or more busses, meshes, matrices, fabrics, a combination of these communication channels, or some other suitable communication channel.

The processing logic 1302 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1302 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1302 may be stored on a computer-readable storage medium, for example, in the form of a computer program. The computer-readable storage medium may be non-transitory. In some cases, the computer-readable medium may be part of the memory 1310.

The memory 1310 may include either volatile or non-volatile, or both volatile and non-volatile types of memory. The memory 1310 may, for example, include random access memory (RAM), read only memory (ROM), Electrically Erasable Programmable Read-Only Memory (EEPROM), flash memory, and/or some other suitable storage media. In some cases, some or all of the memory 1310 may be internal to the computing device 1300, while in other cases some or all of the memory may be external to the computing device 1300. The memory 1310 may store an operating system comprising executable instructions that, when executed by the processing logic 1302, provides the execution environment for executing instructions providing networking functionality for the computing device 1300. The memory may also store and maintain several data structures and routing tables for facilitating the functionality of the computing device 1300.

In some implementations, the configuration module 1304 may include one or more configuration registers. Configuration registers may control the operations of the computing device 1300. In some implementations, one or more bits in the configuration register can represent certain capabilities of the computing device 1300. Configuration registers may be programmed by instructions executing in the processing logic 1302, and/or by an external entity, such as a host device, an operating system executing on a host device, and/or a remote device. The configuration module 1304 may further include hardware and/or software that control the operations of the computing device 1300.

In some implementations, the management module 1306 may be configured to manage different components of the computing device 1300. In some cases, the management module 1306 may configure one or more bits in one or more configuration registers at power up, to enable or disable certain capabilities of the computing device 1300. In certain implementations, the management module 1306 may use processing resources from the processing logic 1302. In other implementations, the management module 1306 may have processing logic similar to the processing logic 1302, but segmented away or implemented on a different power plane than the processing logic 1302.

The bus interface module 1308 may enable communication with external entities, such as a host device and/or other components in a computing system, over an external communication medium. The bus interface module 1308 may include a physical interface for connecting to a cable, socket, port, or other connection to the external communication medium.

The bus interface module 1308 may further include hardware and/or software to manage incoming and outgoing transactions. The bus interface module 1308 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1308 may include the physical layer for any of these bus protocols, including a connector, power management, and error handling, among other things. In some implementations, the computing device 1300 may include multiple bus interface modules for communicating with multiple external entities. These multiple bus interface modules may implement the same local bus protocol, different local bus protocols, or a combination of the same and different bus protocols.

The network interface module 1312 may include hardware and/or software for communicating with a network. This network interface module 1312 may, for example, include physical connectors or physical ports for wired connection to a network, and/or antennas for wireless communication to a network. The network interface module 1312 may further include hardware and/or software configured to implement a network protocol stack. The network interface module 1312 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 1300 may include multiple network interface modules, each configured to communicate with a different network. For example, in these implementations, the computing device 1300 may include a network interface module for communicating with a wired Ethernet network, a wireless 802.11 network, a cellular network, an Infiniband network, etc.

The various components and modules of the computing device 1300, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed with respect to FIG. 14.

Figure 14:
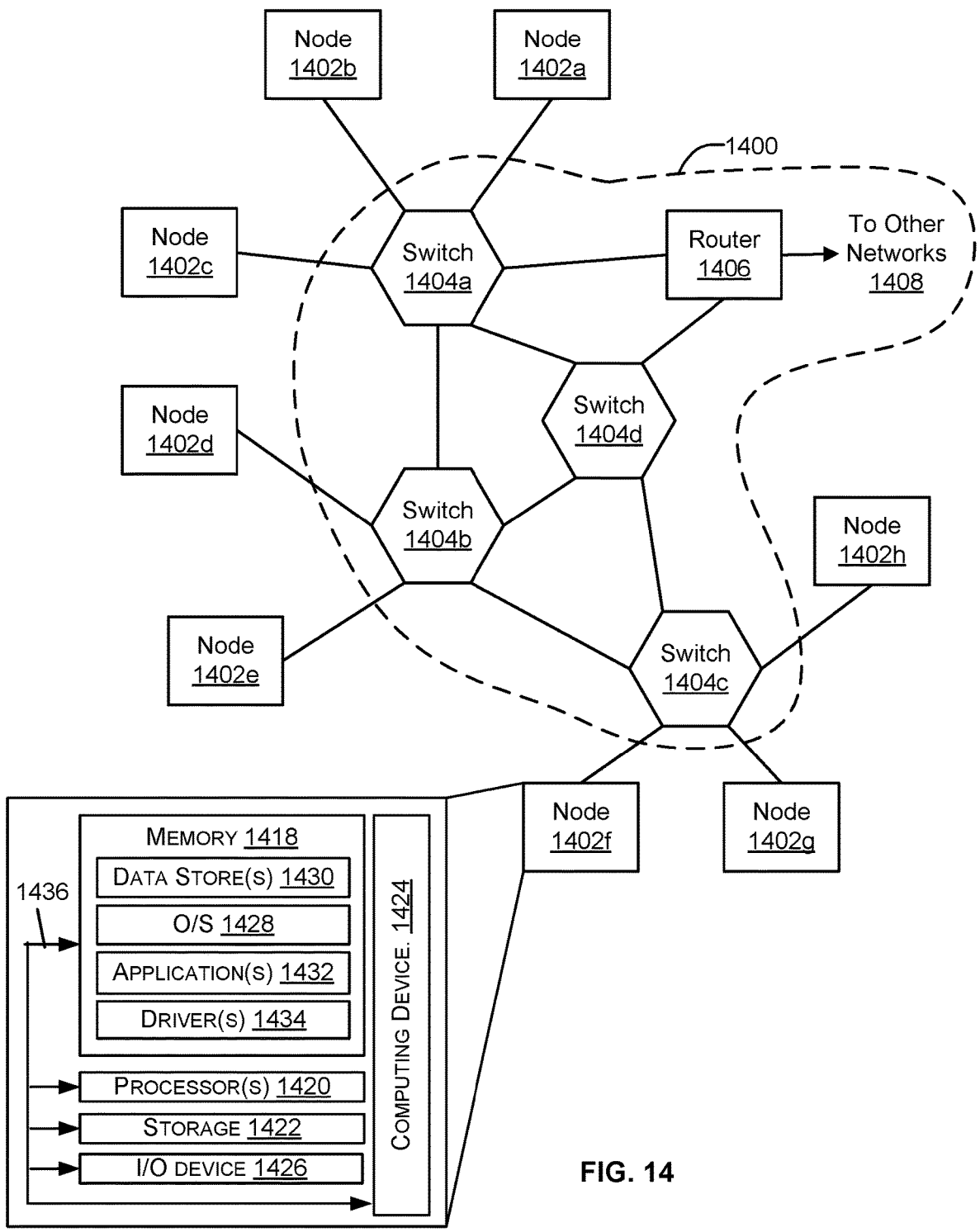
FIG. 14 illustrates an example architecture for features and systems described herein that includes one or more service provider computers and/or a user device connected via one or more networks, according to certain aspects of the disclosure.

FIG. 14 illustrates a network 1400, illustrating various different types of computing devices 1300 of FIG. 13, such as nodes comprising the computing device, switches and routers. In certain embodiments, the network 1400 may be based on a switched architecture with point-to-point links. As illustrated in FIG. 14, the network 1400 includes a plurality of switches 1404*a*-1404*d*, which may be arranged in a network. In some cases, the switches are arranged in a multi-layered network, such as a Clos network. A network device 1300 that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 1404*a*-1404*d* may be connected to a plurality of nodes 1402*a*-1402*h* and provide multiple paths between any two nodes.

The network 1400 may also include one or more network devices 1300 for connection with other networks 1408, such as other subnets, LANs, wide area networks (WANs), or the Internet, and may be referred to as routers 1406. Routers use headers and forwarding tables to determine the best path for forwarding the packets, and use protocols such as internet control message protocol (ICMP) to communicate with each other and configure the best route between any two devices.

In some examples, network(s) 1400 may include any one or a combination of many different types of networks, such as cable networks, the Internet, wireless networks, cellular networks and other private and/or public networks. Interconnected switches 1404*a*-1404*d* and router 1406, if present, may be referred to as a switch fabric, a fabric, a network fabric, or simply a network. In the context of a computer network, terms "fabric" and "network" may be used interchangeably herein.

Nodes 1402*a*-1402*h* may be any combination of host systems, processor nodes, storage subsystems, and I/O chassis that represent user devices, service provider computers or third party computers.

User devices may include computing devices to access an application 1432 (e.g., a web browser or mobile device application). In some aspects, the application 1432 may be hosted, managed, and/or provided by a computing resources service or service provider. The application 1432 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 1408. Additionally, the user device(s) may be part of the distributed system managed by, controlled by, or otherwise part of the service provider computer(s) (e.g., a console device integrated with the service provider computers).

The node(s) of FIG. 14 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 1432 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 1402*a*-1402*h* may include at least one memory 1418 and one or more processing units (or processor(s) 1420). The processor(s) 1420 may be implemented in hardware, computer-executable instructions, firmware, or combinations thereof. Computer-executable instruction or firmware implementations of the processor(s) 1420 may include computer-executable or machine-executable instructions written in any suitable programming language to perform the various functions described.

In some instances, the hardware processor(s) 1420 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 1418 may store program instructions that are loadable and executable on the processor(s) 1420, as well as data generated during the execution of these programs. Depending on the configuration and type of the node(s) 1402*a*-1402*h*, the memory 1418 may be volatile (such as RAM) and/or non-volatile (such as ROM, flash memory, etc.). The memory 1418 may include an operating system 1428, one or more data stores 1430, one or more application programs 1432, one or more drivers 1434, and/or services for implementing the features disclosed herein.

The operating system 1428 may support nodes 1402*a*-1402*h* basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 1428 may also be a proprietary operating system.

The data stores 1430 may include permanent or transitory data used and/or operated on by the operating system 1428, application programs 1432, or drivers 1434. Examples of such data include web pages, video data, audio data, images, user data, and so on. The information in the data stores 1430 may, in some implementations, be provided over the network(s) 1408 to user devices 1404. In some cases, the data stores 1430 may additionally or alternatively include stored application programs and/or drivers. Alternatively or additionally, the data stores 1430 may store standard and/or proprietary software libraries, and/or standard and/or proprietary application user interface (API) libraries. Information stored in the data stores 1430 may be machine-readable object code, source code, interpreted code, or intermediate code.

The drivers 1434 include programs that may provide communication between components in a node. For example, some drivers 1434 may provide communication between the operating system 1428 and additional storage 1422, network device 1424, and/or I/O device 1426. Alternatively or additionally, some drivers 1434 may provide communication between application programs 1432 and the operating system 1428, and/or application programs 1432 and peripheral devices accessible to the service provider computer. In many cases, the drivers 1434 may include drivers that provide well-understood functionality (e.g., printer drivers, display drivers, hard disk drivers, Solid State Device drivers). In other cases, the drivers 1434 may provide proprietary or specialized functionality.

The service provider computer(s) or servers may also include additional storage 1422, which may include removable storage and/or non-removable storage. The additional storage 1422 may include magnetic storage, optical disks, solid state disks, flash memory, and/or tape storage. The additional storage 1422 may be housed in the same chassis as the node(s) 1402a-1402h or may be in an external enclosure. The memory 1418 and/or additional storage 1422 and their associated computer-readable media may provide non-volatile storage of computer-readable instructions, data structures, program modules, and other data for the computing devices. In some implementations, the memory 1418 may include multiple different types of memory, such as SRAM, DRAM, or ROM.

The memory 1418 and the additional storage 1422, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 1418 and the additional storage 1422 are examples of computer storage media. Additional types of computer storage media that may be present in the node(s) 1402a-1402h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 1402a-1402h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 1402a-1402h may also include I/O device(s) 1426, such as a keyboard, a mouse, a pen, a voice input device, a touch input device, a display, speakers, a printer, and the like. The node(s) 1402a-1402h may also include one or more communication channels 1436. A communication channel 1436 may provide a medium over which the various components of the node(s) 1402a-1402h can communicate. The communication channel or channels 1436 may take the form of a bus, a ring, a switching fabric, or a network.

The node(s) 1402a-1402h may also contain network device(s) 1424 that allow the node(s) 1402a-1402h to communicate with a stored database, another computing device or server, user terminals and/or other devices on the network(s) 1400. The network device(s) 1424 of FIG. 14 may include similar components discussed with reference to the computing device 1300 of FIG. 13.

In some implementations, the computing device 1424 is a peripheral device, such as a PCI-based device. In these implementations, the computing device 1424 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 1308 may implement NVMe, and the computing device 1424 may be connected to a computing system using a PCIe interface.

A PCI-based device may include one or more functions. A "function" describes operations that may be provided by the computing device 1424. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the computing device 1424 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers).

Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 13, FIG. 14, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
 a processor;
 a memory coupled to the processor;
 a plurality of functional units, including a Peripheral Component Interconnect Express (PCIe) unit coupled to the processor and a plurality of network interface units; and
 a plurality of debug units, each debug unit associated with a respective functional unit of the plurality of functional units, wherein a given debug unit of the plurality of debug units is configured to track events and monitor performance of its corresponding respective functional unit, the given debug unit having a trace buffer that includes a static random access memory (SRAM), the trace buffer configured to store processing state of the corresponding respective functional unit;
 wherein, upon detection of a PCIe unit error condition, the processor is configured to issue a debug reset command to reset each of the plurality of functional units, without issuing the debug reset command to the plurality of debug units, thereby retaining information stored in the trace buffer SRAM to be read by the processor for debugging the PCIe unit error condition;
 wherein the given debug unit is configured to, upon receiving a power-up reset command from the processor, clear information stored in the trace buffer SRAM.

2. The system of claim 1, wherein the PCIe unit error condition comprises a condition in which the PCIe unit has encountered errors or is not responding.

3. The system of claim 1, wherein the debug unit associated with each functional unit comprises:
 a bus monitor unit configured to track bus transactions through the functional unit;

a performance monitor unit configured to track incoming event triggers; and a tracer unit configured to provide low level signal level visibility and trace buffers.

4. The system of claim 1, wherein the given debug unit comprises a local time stamp counter configured to either clear or increment in response to a global debug unit.

5. The system of claim 4, wherein the given debug unit is configured to:
store time stamp information in the trace buffer SRAM; and
upon receiving the power-up reset command, clear time stamp information stored in the trace buffer SRAM.

6. An integrated circuit, comprising:
a plurality of functional units;
a plurality of local debug units, each local debug unit associated with a respective functional unit of the plurality of functional units, wherein a given local debug unit of the plurality of local debug units comprises a trace buffer, and wherein the given local debug unit is configured to track and store operation information of its corresponding respective functional unit in the trace buffer;
a global debug unit configured to coordinate operations of the plurality of local debug units and provide cross triggering between different local debug units and correlations between events occurring in different functional units, each of the plurality of local debug units coupled to the global debug unit;
wherein the integrated circuit is configured to:
send a debug reset command to reset a functional unit, without sending the debug reset command to the corresponding respective local debug unit, thereby retaining information stored in the trace buffer; and
send a power-up reset command to reset a local debug unit and the corresponding respective functional unit, thereby causing the local debug unit to clear the trace buffer;
wherein each of the plurality of local debug units is further configured to:
upon receiving a power-up reset command, clear time stamp information; and
upon receiving a debug reset command, read time stamp information in the respective functional unit and store the time stamp information in an SRAM in the trace buffer of the local debug unit.

7. The integrated circuit of claim 6, wherein the trace buffer of each of the plurality of local debug units comprises a static random access memory (SRAM).

8. The integrated circuit of claim 6, wherein each of the plurality of local debug units is configured to track events and monitor performance of the corresponding respective functional unit.

9. The integrated circuit of claim 8, wherein each of the plurality of functional units is configured to reset upon receiving the debug reset command or the power-up reset command.

10. The integrated circuit of claim 6, wherein each of the plurality of local debug units comprises:
a bus monitor unit configured to track bus transactions through the functional unit;
a performance monitor unit configured to track incoming event triggers; and
a tracer unit configured to provide low level signal level visibility and trace buffers.

11. The integrated circuit of claim 6, wherein each of the plurality of local debug units comprises a local time stamp counter configured to either clear or increment in response to the global debug unit.

12. The integrated circuit of claim 6, further comprising a reset signal handling circuit, the reset signal handling circuit comprising:
a first signal path directing a debug reset command to each of the plurality of functional units; and
a second signal path including a local phase-locked-loop (PLL) to each of the plurality of local debug units.

13. The integrated circuit of claim 6, wherein the plurality of functional units comprises a PCIe (Peripheral Component Interconnect Express) interface unit.

14. The integrated circuit of claim 13, wherein each of the plurality of local debug units is configured to store processing state of the PCIe interface unit comprising inbound and outbound transactions going through the PCIe interface unit.

15. A method, comprising:
during execution of operations in a functional unit in an integrated circuit, storing processing state of the functional unit in a trace buffer in a local debug unit of the functional unit, the processing state being associated with execution of operations in the functional unit;
receiving a first reset command in the integrated circuit;
upon determining that the first reset command is a debug reset command:
retaining information stored in the trace buffer;
reading time stamp information and storing the time stamp information in the trace buffer; and
resetting the processing state of the functional unit; and
receiving a second reset command in the integrated circuit;
upon determining that the second reset command is a power-up reset command:
clearing the trace buffer including the time stamp information stored in the trace buffer; and
resetting the functional unit;
synchronizing a local time stamp counter in the local debug unit to a time stamp counter in a global debug unit in the integrated circuit;
wherein the global debug unit is configured to coordinate operations of the local debug unit with other local debug units and provide cross triggering between different local debug units and correlations between events occurring in different functional units, each of the local debug units coupled to the global debug unit.

16. The method of claim 15, wherein the trace buffer of the debug unit comprises a static random access memory (SRAM) for storing the processing state of the functional unit.

17. The method of claim 15, further comprising, during execution of operations in the functional unit, the debug unit tracking events and monitoring performance of the functional unit.

18. The method of claim 15, further comprising, upon receiving a debug reset command, retaining local time stamp information stored in the trace buffer of the local debug unit.

* * * * *